United States Patent
Friedrich et al.

(10) Patent No.: US 7,450,913 B2
(45) Date of Patent: Nov. 11, 2008

(54) CIRCUIT ARRANGEMENT FOR A WIDEBAND MIXER WITH PREDISTORTION AND HIGH LINEARITY

(75) Inventors: Martin Friedrich, Gelsenkirchen (DE); Christian Grewing, Sollentuna (SE); Giuseppe Li Puma, Bochum (DE); Christoph Sandner, Villach (AT); Andreas Wiesbauer, Pörtschach (AT); Kay Winterberg, Kempen (DE); Stefan Van Waasen, Sollentuna (SE)

(73) Assignee: Infineon Technologies AG, Munich (DE)

( * ) Notice: Subject to any disclaimer, the term of this patent is extended or adjusted under 35 U.S.C. 154(b) by 517 days.

(21) Appl. No.: 11/111,461

(22) Filed: Apr. 21, 2005

(65) Prior Publication Data
US 2005/0277389 A1 Dec. 15, 2005

(30) Foreign Application Priority Data
Apr. 21, 2004 (DE) .................... 10 2004 019 366

(51) Int. Cl.
*H04B 1/04* (2006.01)
(52) U.S. Cl. ............... 455/114.3; 455/127.1; 455/67.13
(58) Field of Classification Search ............. 455/114.3, 455/63, 501, 67.3, 127, 330, 67.13, 127.1, 455/504; 375/296, 297, 318; 329/318
See application file for complete search history.

(56) References Cited

U.S. PATENT DOCUMENTS

| | | | |
|---|---|---|---|
| 4,532,604 A * | 7/1985 | Baker | 708/845 |
| 5,589,791 A | 12/1996 | Gilbert | |
| 6,140,849 A | 10/2000 | Trask | |
| 6,324,383 B1 * | 11/2001 | Myers | 455/63.1 |
| 6,674,808 B1 * | 1/2004 | Griph et al. | 375/285 |
| 7,095,799 B2 * | 8/2006 | Braithwaite | 375/296 |
| 2004/0052314 A1* | 3/2004 | Copeland | 375/296 |
| 2005/0111575 A1* | 5/2005 | Taler et al. | 375/297 |

FOREIGN PATENT DOCUMENTS

DE 100 45 564 A1 4/2002
DE 696 19 437 T2 2/2003

* cited by examiner

*Primary Examiner*—Tony T Nguyen
(74) *Attorney, Agent, or Firm*—Maginot Moore & Beck

(57) ABSTRACT

Circuit arrangement for a wideband mixer (1, 101, 201) with a multiplicative mixing stage (2) which exhibits a carrier frequency input (3, 4) for coupling in a differential carrier frequency signal (LOP, LON), a mixing stage input (5, 6) for coupling in a predistorted differential input signal (LFPD, LFND), and an output (9, 10) for coupling out a differential output signal (OUTP, OUTN) which is generated from the differential carrier frequency signal (LOP, LON) and the predistorted differential input signal (LFPD, LFND) by multiplicative mixing, the predistorted differential input signal (LFPD, LFND) being generated from a differential input signal (LFP, LFN) by means of a quadratic predistortion and a linear predistortion.

20 Claims, 7 Drawing Sheets

CIRCUIT ARRANGEMENT FOR A WIDEBAND MIXER WITH PREDISTORTION AND HIGH LINEARITY

FIELD OF THE INVENTION

The present invention relates to a circuit arrangement for a wideband mixer with predistortion and high linearity. The invention also relates to a method for wideband mixing.

BACKGROUND

Mixers are needed for frequency conversion in transmitters and receivers and, therefore, belong to the important components for wireless transmission systems. An ideal mixer can be implemented by means of a multiplier. This multiplies a local-oscillator signal by an input signal to be converted to form an output signal.

Conventional mixers are operated within a relatively narrow carrier-frequency range—such as, for example, in WLAN (wireless local area network) applications around 20 MHz. Recently, however, particularly wideband applications are needed in frequency bands from 3 to 10 GHz, so-called UWB (ultra wide band) applications.

FIG. 1 shows a basic modulator or mixer topology.

Two single-sideband mixing branches are provided, the signals OUTU, OUTL of which are combined by means of an adder A1 to form the modulated output signal MOUT. In the branch for the upper sideband, digital input signal data DLF1, which are converted into the analog signal LF1 by a digital/analog converter DA1, are generated from a ROM memory SINROM which contains sinusoidal data, in dependence on a control signal S1. The analog signal LF1 is filtered by a low-pass filter LPF1 to form the signal LH1' to be converted.

The analog signal LH1' to be converted is mixed with a sinusoidal carrier sequence signal with the angular frequency $\omega_{LO}$ in a multiplicative mixing stage M1 to form the output signal OUTU for the upper sideband.

Analogously, digital data DLF2, an analog conversion signal LF2 for the lower sideband and, by means of a filtered conversion signal LF2' and a cosinusoidal carrier signal for the lower sideband with the angular frequency $\omega_{LO}$, an output signal OUTL are generated in the branch for the lower sideband by means of a ROM memory COSROM containing cosinusoidal data, a second digital/analog converter DA2, a low-pass filter LPF2 and a multiplicative mixing stage M2 by means of a control signal S2.

A possible multiplicative mixing stage is represented by the so-called Gilbert cell. Such a multiplicative mixing stage according to the prior art is described, for example, in U. Tietze, C H. Schenk: Halbleiter-schaltungstechnik (Semiconductor circuit technology), Edition 12, Springerverlag Berlin, Heidelberg, New York, ISBN 3-540-42849-6.

FIG. 2 shows a corresponding Gilbert cell for multiplicatively mixing a differential input signal LFP, LFN with a differential carrier frequency signal LOP, LON to form a differential output signal OUTP, OUTN.

Accordingly, a first resistor R1, the controlled path of a first transistor T1, the controlled path of a second transistor T2 and the controlled path of a current source transistor T3 are provided in series between a first supply voltage potential VDD and a second supply voltage potential VSS.

A second resistor R2 and the controlled path of a fourth transistor T4 are provided between the first supply voltage potential VDD and the controlled path of the second transistor T2. A bias potential BIAN is applied to a gate terminal of the current source transistor T3.

The controlled path of a fifth transistor T5 and the controlled path of a sixth transistor T6 are connected between the second resistor R2 and the controlled path of the current source transistor T3. Furthermore, the controlled path of a seventh transistor T7 is connected between the first resistor R1 and the controlled path of the sixth transistor T6.

A first component LFP of the differential input signal is connected to the gate terminal of the sixth transistor T6 and the second component LFN of the input signal is connected to the gate terminal of the second transistor T2.

A first component LOP of the carrier frequency signal is connected to the gate terminal of the first transistor T1 and the gate terminal of the fifth transistor T5. The second component LON of the differential carrier frequency signal is connected to the gate terminal of the fourth transistor T4 and the gate terminal of the seventh transistor T7.

The first component OUTP of the differential output signal is picked up between the first resistor and the controlled path of the first transistor T1. The second component OUTN of the output signal is picked up between the second resistor and the controlled path of the fourth transistor T4.

The resistors R1 and R2 act as load resistors. Such a Gilbert cell according to FIG. 2 only has inadequate characteristics of linearity for UWB applications. This leads to harmonic distortions, in particular because the output characteristic of the differential pair of transistors T1, T5, T7, T4 is quadratic.

When they are constructed as NMOS transistors, transistors T1-T7 operate in the inversion region so that the voltages dropped across the load resistors R1, R2 are proportional to the square root of the input voltage which is coupled in by the differential signal LFP, LFN.

With ideal components, this nonlinearity can be largely compensated for by a quadratic predistortion of the input signal LFP, LFN. For this purpose, NMOS diodes can be used, for example, which are connected between the first supply voltage VDD and the respective gate terminals of the transistors T2 and T6. As a result, a quadratic predistorted input signal component in each case occurs which can compensate for the square root nonlinearity of the mixing stage.

In this arrangement, however, accurate matching of the two diodes is very difficult, particularly when the mixing stage is constructed in MOS. A mismatch of such predistortion diodes easily leads to additional components of the carrier frequency in the output signal of such a mixing stage.

SUMMARY

It is, therefore, an object of the present invention to create a circuit arrangement for a wideband mixer with predistortion and high linearity which can be used in UWB applications and is tolerant to mismatches in the predistortion.

It is also an object of the present invention to create a wideband mixer which offers a greater spurious-interference-free dynamic range compared with mixers with quadratic predistortion.

This object is achieved by a circuit arrangement for a wideband mixer according to embodiments of the invention and by a method for mixing a carrier frequency signal and an input signal according to embodiments of the invention.

Accordingly, a circuit arrangement for a wideband mixer with a multiplicative mixing stage is provided which exhibits a carrier frequency input for coupling in a differential carrier frequency signal, a mixing stage input for coupling in a predistorted differential input signal and an output for coupling out a differential output signal. In this arrangement, the differential output signal is generated from the differential carrier frequency signal and the predistorted differential input signal by multiplicative mixing. The predistorted differential input signal is generated from a differential input signal by means of a quadratic predistortion and a linear predistortion.

According to the method according to the invention for mixing a carrier frequency signal and an input signal, the following method steps are provided:
(a) linear predistorting and quadratic predistorting of the input signal for generating a predistorted input signal; and
(b) multiplicative mixing of the predistorted input signal with the carrier frequency signal to form an output signal.

The basic concept of the invention consists in performing a linear predistortion in addition to a quadratic predistortion of the input signal to be converted.

As a result, the influence of a mismatch of components in the signal path, which generate quadratic predistortion, is reduced. Furthermore, output signal components which exhibit the frequency of the carrier signal are reduced. Since artifacts of the carrier frequency in the output signal are reduced by the linear predistortion in comparison with the signal components to be transmitted, particularly in the upper and lower sideband and with respect to higher harmonic conversion products, a mixer according to the invention provides a particularly large spurious-interference-free dynamic range.

The linear signal component which is achieved by the additional predistortion according to the invention is then adjusted in such a manner that, for example, the difference of the transmitted energy by the carrier and the transmitted energy in a relevant sideband becomes maximum. In particular, future UWB applications specify particular masks for the spectral densities in which the transmitted energy is plotted with respect to frequency, of the mixer used. In this arrangement, the so-called spurious-interference-free dynamic range of the mixer is specified which is particularly high for the circuit arrangement according to the invention.

Moreover, the wideband mixer according to the invention meets high linearity requirements over a very large frequency range.

The differential input signal advantageously exhibits a first component which is coupled to a first input terminal, and exhibits a second component which is coupled to a second input terminal. In this arrangement, a first resistor is connected between the first input terminal and a first supply voltage potential and a second resistor is connected between the second input terminal and the first supply voltage potential for the purpose of linear predistortion. A first component of the predistorted differential input signal can then be picked up between the first resistor and the first input terminal, and a second component of the predistorted differential input signal can be picked up between the second resistor and the second input terminal. By connecting the resistor, a linear signal component is impressed on the respective input signal components.

The first and second resistor is particularly advantageously an adjustable resistor. As a result, the linear predistortion can be flexibly adapted.

According to an embodiment of the circuit arrangement according to the invention, the first and second resistors are switchable and further switchable resistors connected in parallel with these are provided.

According to a preferred embodiment, the circuit arrangement according to the invention exhibits a first and a second transistor having in each case a controlled path and a gate terminal, the controlled path of the first transistor being connected between the input terminal and the first supply voltage potential. In this arrangement, the controlled path of the second transistor is connected between the second input terminal and the first supply voltage potential and the gate terminals are connected to one another. The gate terminals are connected to a distortion potential.

Changing the distortion potential changes the characteristics of the controlled paths in such a manner that the extent of the quadratic predistortion which occurs due to the controlled paths is also adjustable.

In an advantageous embodiment, the distortion potential is the first supply potential. The first and second transistors are then connected as diodes. These diodes provide exactly the desired quadratic predistortion.

In an alternative embodiment, a first diode which is connected between the first input terminal and the first supply voltage potential is provided and a second diode, which is connected between the second input terminal and the first supply potential is provided.

In a preferred embodiment, the multiplicative mixing stage exhibits a Gilbert cell.

In a preferred development of the circuit arrangement, a predistortion control is also provided, having a test signal output for outputting a differential test signal to the input terminals of the circuit arrangement, with a test signal input for coupling in the differential output signal of the mixing stage, and with at least two control outputs for outputting adjustment signals for adjusting the first and second resistor.

The linear predistortion can be optimally adjusted by adjusting the resistance values of the resistors by coupling in test signals at the input of the circuit arrangement and, at the same time, evaluating the output signal generated.

The circuit arrangement is advantageously constructed in MOS technology. Current-saving components which are simple to produce are indicated particularly in the case of UWB applications. This can be achieved in a particularly simple manner in MOS technology.

The resistors for linear predistortion are preferably dimensioned in such a manner that the spurious-interference-free dynamic range of the output signal of the mixer according to the invention is maximum with a differential input signal with predetermined frequency.

The resistors can be adjusted or dimensioned, for example, by means of the predistortion control or determined by simulations even before production.

In a particularly preferred embodiment, the resistors for linear predistortion are dimensioned in such a manner that over a predetermined range of carrier frequencies the signal energy of an output signal is equal to the signal energy of a third harmonic of the input signal in the output signal at the frequency of the carrier signal. Since the linear predistortion, in particular, generates third harmonics as a byproduct, a particularly large spurious-interference-free dynamic range can be achieved by means of this adjustment of the predistortion.

Further advantageous embodiments and developments of the invention are subject-matter of the subclaims and of the subsequent description and referring to the figures.

BRIEF DESCRIPTION OF THE DRAWINGS

In the text which follows, the invention will be explained in greater detail with reference to the diagrammatic figures and exemplary embodiments. In the figures.

DETAILED DESCRIPTION

Figure 1:
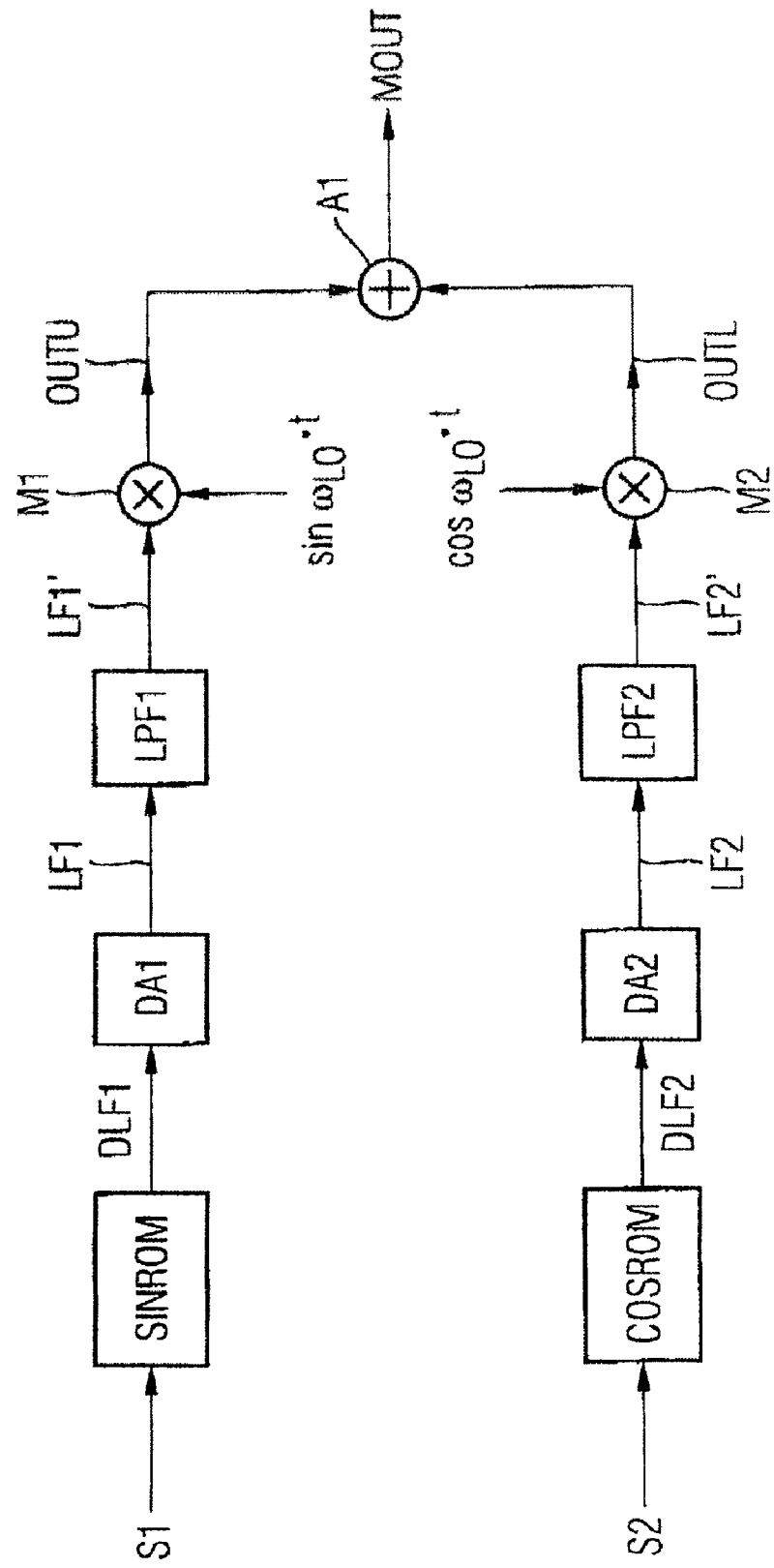
FIG. 1 shows a single-sideband mixer architecture according to the prior art.
Figure 2:
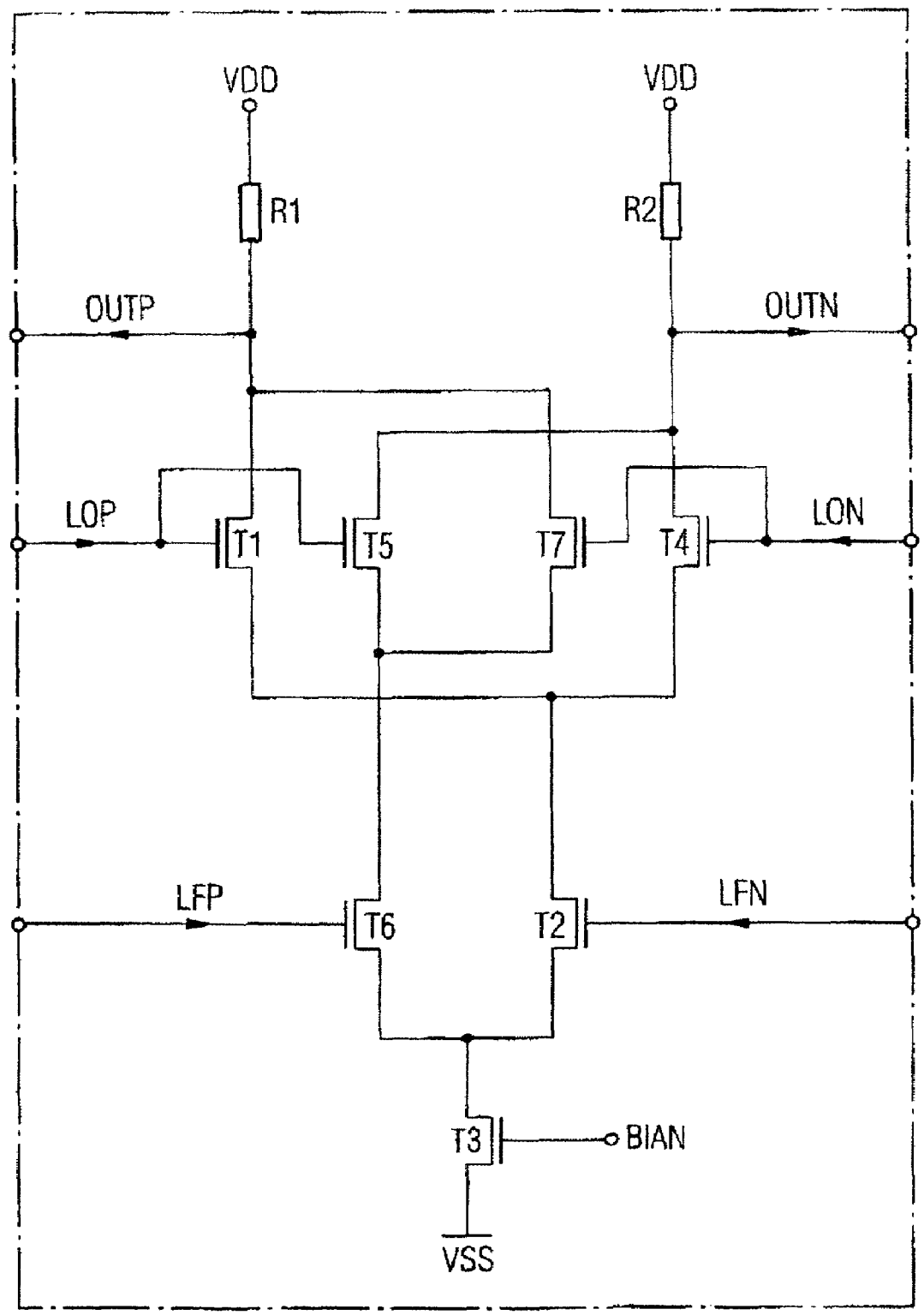
FIG. 2 shows a Gilbert cell according to the prior art.

FIGS. 1 and 2 have already been described in the introduction.

Figure 3:
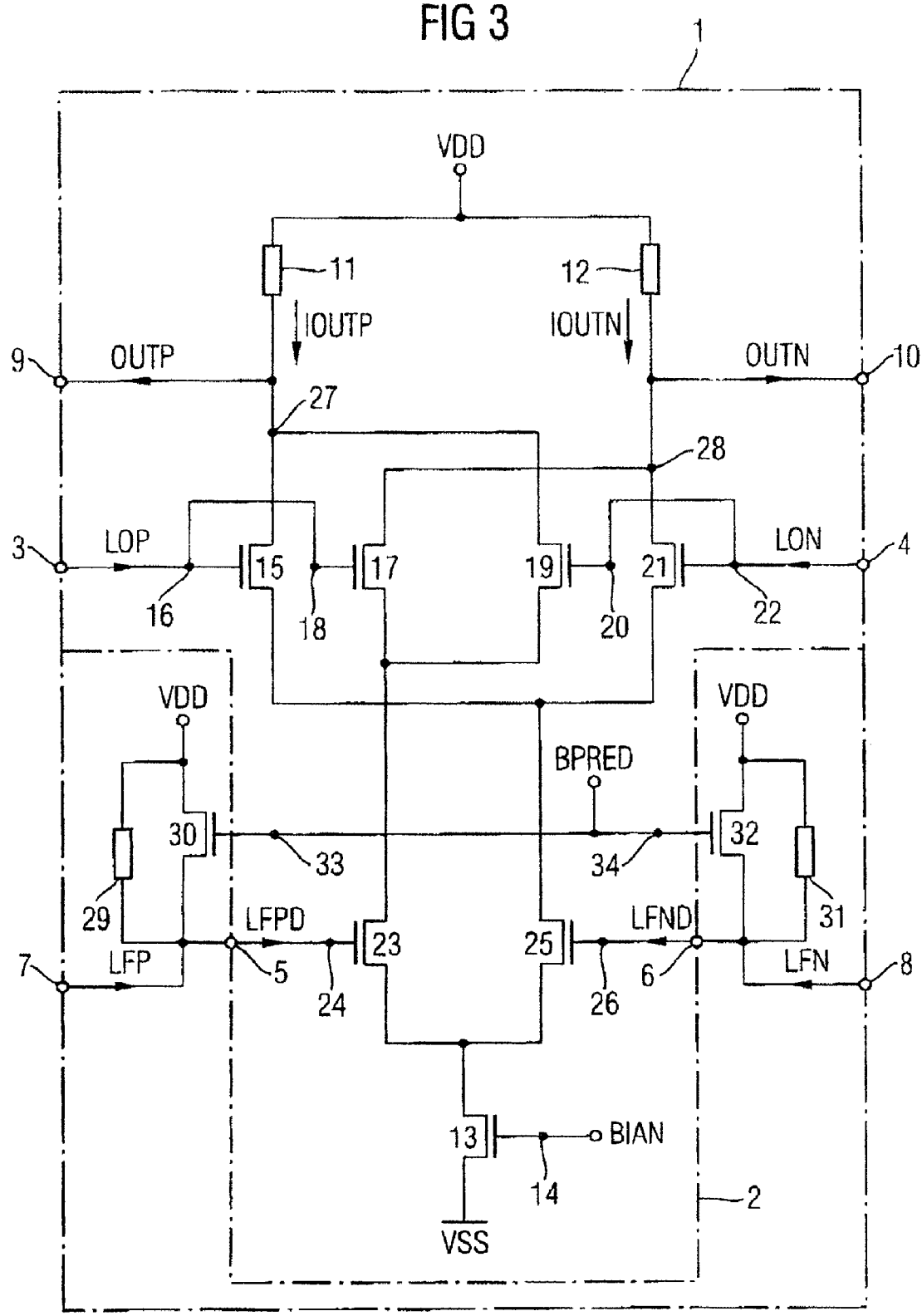
FIG. 3 shows a first embodiment of the circuit arrangement according to the invention for a wideband mixer.

FIG. 3 shows a first embodiment of the circuit arrangement according to the invention for a wideband mixer 1.

A multiplicative mixing stage 2 is provided which is constructed, for example, as a Gilbert cell. The multiplicative mixing stage 2 exhibits a carrier frequency input 3, 4 into which the differential carrier frequency signal LOP, LON is coupled.

The differential carrier signal exhibits a first component LOP which is connected to the first carrier signal terminal 3, and the differential carrier signal exhibits a second component LON which is connected to a second carrier signal terminal 4.

The multiplicative mixing stage 2 exhibits a mixing stage input 5, 6 for coupling in a predistorted differential input signal LFPD, LFND. In this arrangement, a first component LFPD of the predistorted differential input signal is connected to a first mixing stage input terminal 5, and a second component LFD of the differential predistorted input signal is connected to a second mixing stage input terminal 6.

The differential input signal LFP, LFN is coupled in at an input 7, 8 of the mixer 1 according to the invention. In this arrangement, a first component LFP of the differential input signal is connected to a first input terminal 7 and a second component LFN of the differential input signal is connected to a second input terminal 8.

The differential output signal OUTP, OUTN is output at an output 9, 10. In this arrangement, a first component OUTP of the differential output signal can be picked up at an output terminal 9 and a second component OUTN of the differential output signal can be picked up at a second output terminal 10.

The multiplicative mixing stage 2 exhibits a first resistor 11, a second resistor 12, a current source transistor 13 with a controlled path and a gate terminal 14, a first, second, third, fourth, fifth and sixth transistor 15, 17, 19, 21, 23, 25 having in each case a controlled path and a gate terminal 16, 18, 20, 22, 24, 26.

The first resistor 11, the controlled path of the first transistor 15, the controlled path of the sixth transistor 25 and the controlled path of the current source transistor 13 are connected serially between a first supply voltage potential VDD and a second supply voltage potential VSS.

The second resistor 12, the controlled path of the second transistor 17 and the controlled path of the fifth transistor 23 are connected serially between the first supply voltage potential VDD and the controlled path of the current source transistor 13.

A first node 27 is provided between the first resistor 11 and the controlled path of the first transistor 15. A second node 28 is provided between the second resistor 12 and the controlled path of the fourth transistor 21.

The controlled path of the second transistor 17 is connected between the second node 28 and the controlled path of the fifth transistor 23. The controlled path of the third transistor 19 is connected between the first node 27 and the controlled path of the fifth transistor 23.

The gate terminal 16 of the first transistor 15 and the gate terminal 18 of the second transistor 17 are connected to the first carrier frequency terminal 3. The gate terminal 20 of the third transistor and the gate terminal 22 of the four transistor is connected to the second carrier frequency terminal 4.

The first component OUTP of the output signal can be picked up at the first node 27 and is connected to the first output terminal 9. The second component OUTN of the output signal can be picked up at the second node 28 and is connected to the second output terminal 10.

The gate terminal 24 of the fifth transistor 23 is coupled to the first mixing stage input terminal 5, and the gate terminal 26 of the sixth transistor 25 is connected to the second mixing stage input terminal 6.

In each case, an output signal current IOUTP, IOUTN, flows via the first and second resistor 11, 12, as a result of which the respective signal voltage of the output signal OUTP, OUTN is generated.

Between the first input terminal 7 and the first supply voltage potential VDD, a third resistor 29 and the controlled path of a seventh transistor 30 are connected in parallel.

Between the first supply voltage potential VDD and the second input terminal 8 of the mixer 1, a fourth resistor 31 and the controlled path of an eighth transistor 32 are connected in parallel. The gate terminals 33, 34 of the seventh and eighth transistors 30, 32 are applied to a distortion potential BPRED. The gate terminal 14 of the current source transistor 13 is applied to a BIAS potential BIAN.

As has already been mentioned in the introduction, the multiplicative mixing stage 2 (Gilbert cell) does not operate in a linear manner, i.e. the output currents IOUTP, IOUTN are proportional to the square root of the input voltage of the differential input signal LFP, LFN.

The input signal LFP, LFN is quadratically predistorted by means of the seventh and eighth transistor 30, 32, so that at least a part of the nonlinearity due to the mixing stage is compensated for. However, since it is difficult in production to make the transistors 30, 32 completely identical, a mismatch can easily occur. A mismatch of the seventh and eighth transistors 30, 32 causes interference mainly of the carrier frequency signal LOP, LON with the output signal OUTP, OUTN.

The additional linear predistortion which is also generated by the third and fourth resistor 29, 31, effectively reduces the interference of the carrier frequency signal LOP, LON with the output signal OUTP, OUTN.

The amount of linear predistortion is set by choosing the resistance values of the third and fourth resistor 29, 31 and the amount of quadratic predistortion is set by changing the distortion potential BPRED which is applied to the gate terminals 33, 34 of the seventh and eighth transistor 30, 32.

Figure 4:
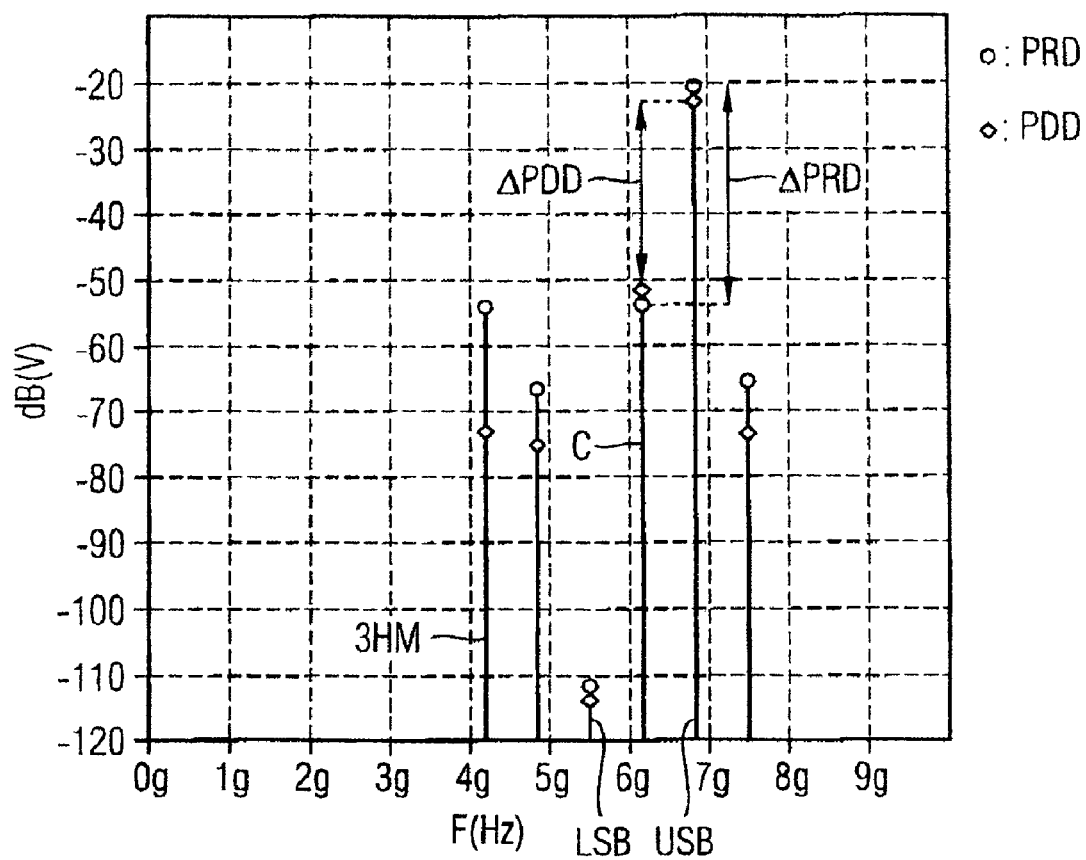
FIG. 4 shows a spectral representation of the conversion products of a mixer according to the invention and of a conventional mixer.

FIG. 4 shows a spectral representation of the conversion products of a mixer according to the invention as shown, for example, in FIG. 3.

FIG. 4 shows the output spectrum of a mixer only using quadratic predistortion by means of MOS diodes (PDD spectral lines) and the spectrum of a mixer according to the invention using quadratic and linear predistortion by means of diodes and resistors (PRD spectral lines).

The frequency of the carrier frequency signal has here been chosen as 6.18 gigahertz and the input signal as 660 megahertz.

The spurious-interference-free dynamic range of the mixer using only quadratic predistortion is obtained from the difference between the energies (here represented as degree of amplification in decibels as ratio of the input voltage to the output voltage), resulting in a spurious-interference-free dynamic range of ΔPDD=28.25 decibels. This is obtained from the difference between the degree of amplification of the upper sideband USB and the degree of amplification of the carrier signal C.

The dynamic range ΔPRD of the mixer with linear and quadratic predistortion is about 33.9 decibels and is thus greatly improved.

The linear predistortion can lead to an amplification of the third harmonic (or third-order harmonic, respectively) of the input signal in the output spectrum of the mixer.

In the example chosen here, the linear predistortion or the resistance value, respectively, is set in such a manner that the degree of amplification of the third harmonic 3 HM is equal to that of the carrier signal C. In this manner, a compromise between the generation of the third harmonic 3 HM and an extended dynamic range ΔPRD can be achieved by setting the resistances or linear distortion, respectively. The spectrum according to FIG. 4 also shows the lower sideband LSB.

Figure 5:
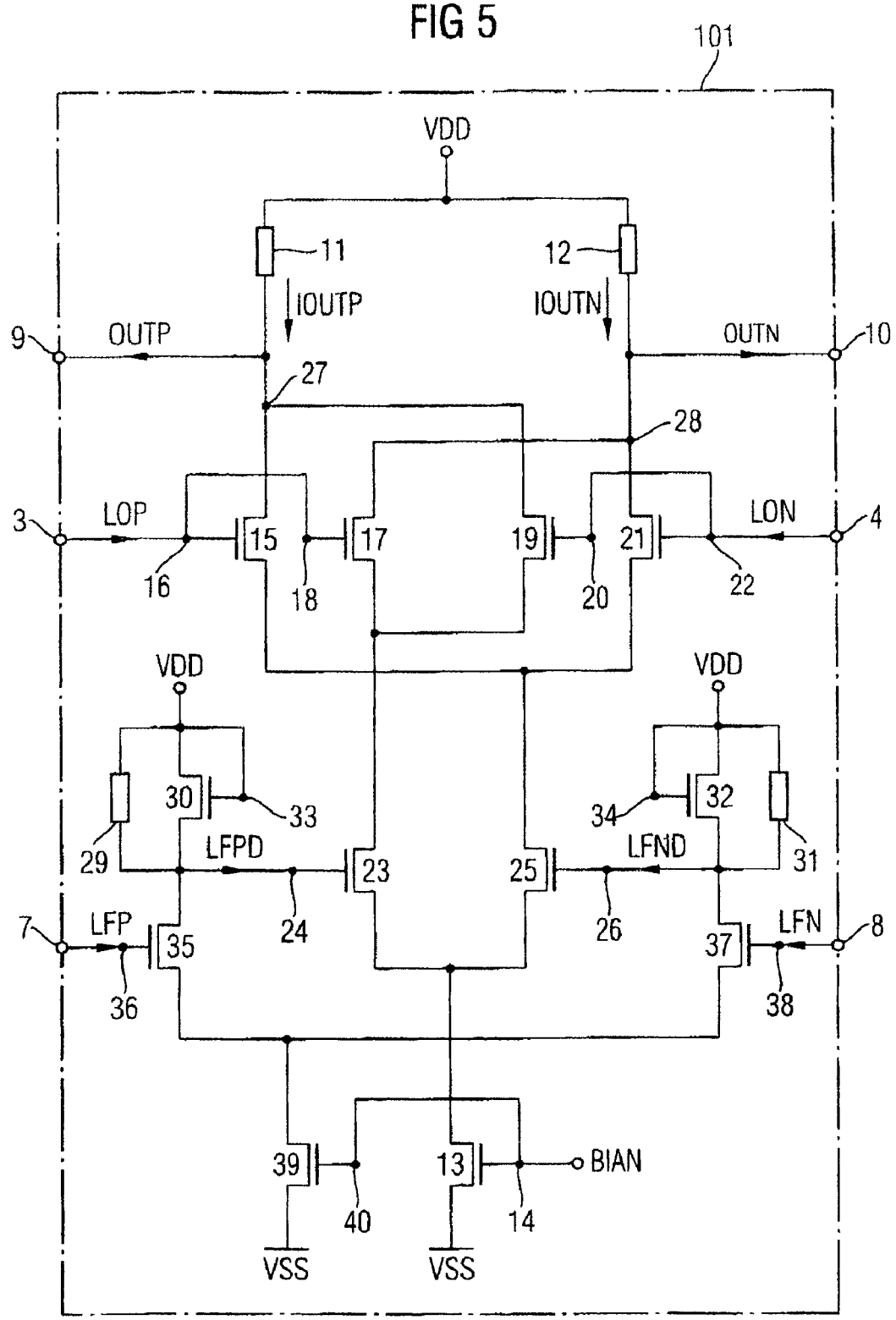
FIG. 5 shows a second embodiment of the circuit arrangement according to the invention.

FIG. 5 shows a second embodiment of the circuit arrangement according to the invention for a wideband mixer.

The second embodiment essentially exhibits the same components as the embodiment according to FIG. 3 but the predistortion potential is identical with the first supply voltage potential VDD.

The seventh and the eighth transistor 30, 32 is thus in each case connected as a diode. Furthermore, a ninth and tenth transistor 35, 37 having in each case a controlled path and a gate terminal 36, 38 and a second current source transistor 39 having a controlled path and a gate terminal 40 are provided.

In the second embodiment of the mixer 101, the first component LFP of the differential input signal is coupled to the gate terminal 36 of the ninth transistor 35. The second component LFN of the differential input signal is coupled to the gate terminal 38 of the tenth transistor 37.

The controlled path of the ninth transistor 35 and the controlled path of the second current source transistor 39 is connected between the third resistor 29 and, respectively, the controlled path of the seventh transistor 30 and the second supply voltage potential VSS.

The controlled path of the tenth transistor 37 is connected between the fourth resistor 31 and, respectively, the controlled path of the eighth transistor 32 and the controlled path of the second current source transistor 37.

Figure 6:
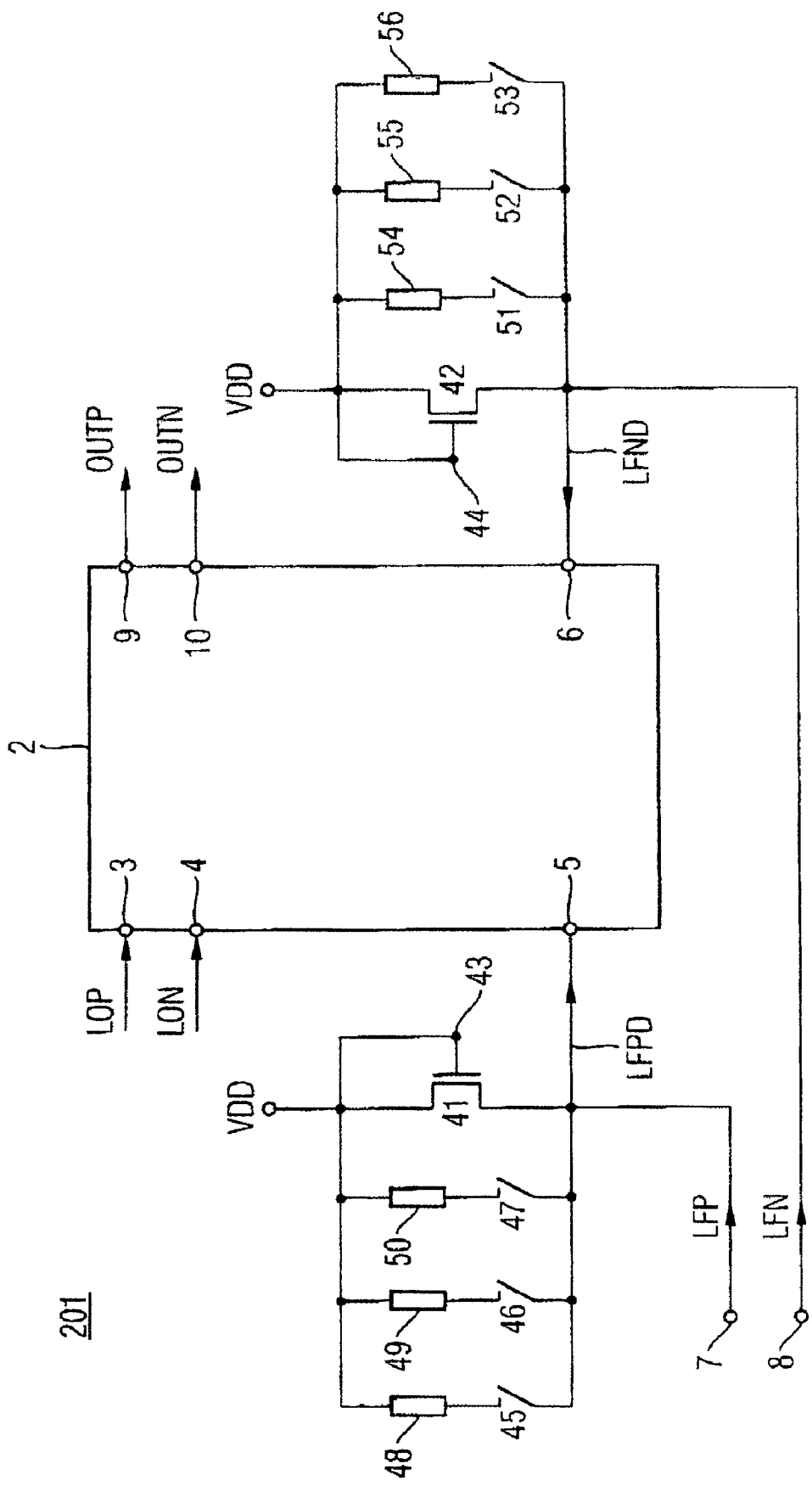
FIG. 6 shows a third embodiment of the circuit arrangement according to the invention.

FIG. 6 shows a third embodiment 201 of the mixer according to the invention.

A multiplicative mixing stage 2 is provided which exhibits an input 3, 4 for the carrier frequency signal LON, LOP, an output 9, 10 for the differential output signal OUTP, OUTN, and a first mixing stage input terminal 5 for the first component LFPD of the predistorted input signal and a second mixing stage input terminal 6 for the second component LFND of the predistorted input signal.

The first component LFP of the differential input signal is coupled to a first input terminal 7 and the second component LFN of the differential input signal is coupled to a second input terminal 8.

A first transistor 41 with a controlled path and a gate terminal 43 and a second transistor 42 with a controlled path and a gate terminal 44 are provided. The controlled path of the first transistor 41 is connected between a first supply voltage potential VDD and the first mixing stage input terminal 5. The gate terminal 43 of the first transistor 41 is connected to the first supply voltage potential VDD.

The controlled path of the second transistor 42 is connected between the first supply voltage potential VDD and the second mixing stage input terminal 6. The gate terminal 44 of the second transistor 42 is connected to the first supply voltage potential VDD.

Three resistors 48, 49, 50, which can be connected via switches 45, 46, 47 are arranged in parallel so that they can be connected to the controlled path of the first transistor 41.

Three further resistors 54, 55, 56, which can be connected via switches 51, 52, 53, are connected in parallel so that they can be connected to the control path of the second transistor 42.

The two transistors 41, 42 are again connected as diodes and generate the quadratic predistortion of the differential input signal LFP, LFN.

Various linear predistortions can be set by combining the connectable resistors 48, 49, 50, 54, 55, 56 in various ways. As a result, the optimum linear predistortion can be easily adjusted in order to achieve the greatest possible spurious-interference-free dynamic range.

Figure 7:
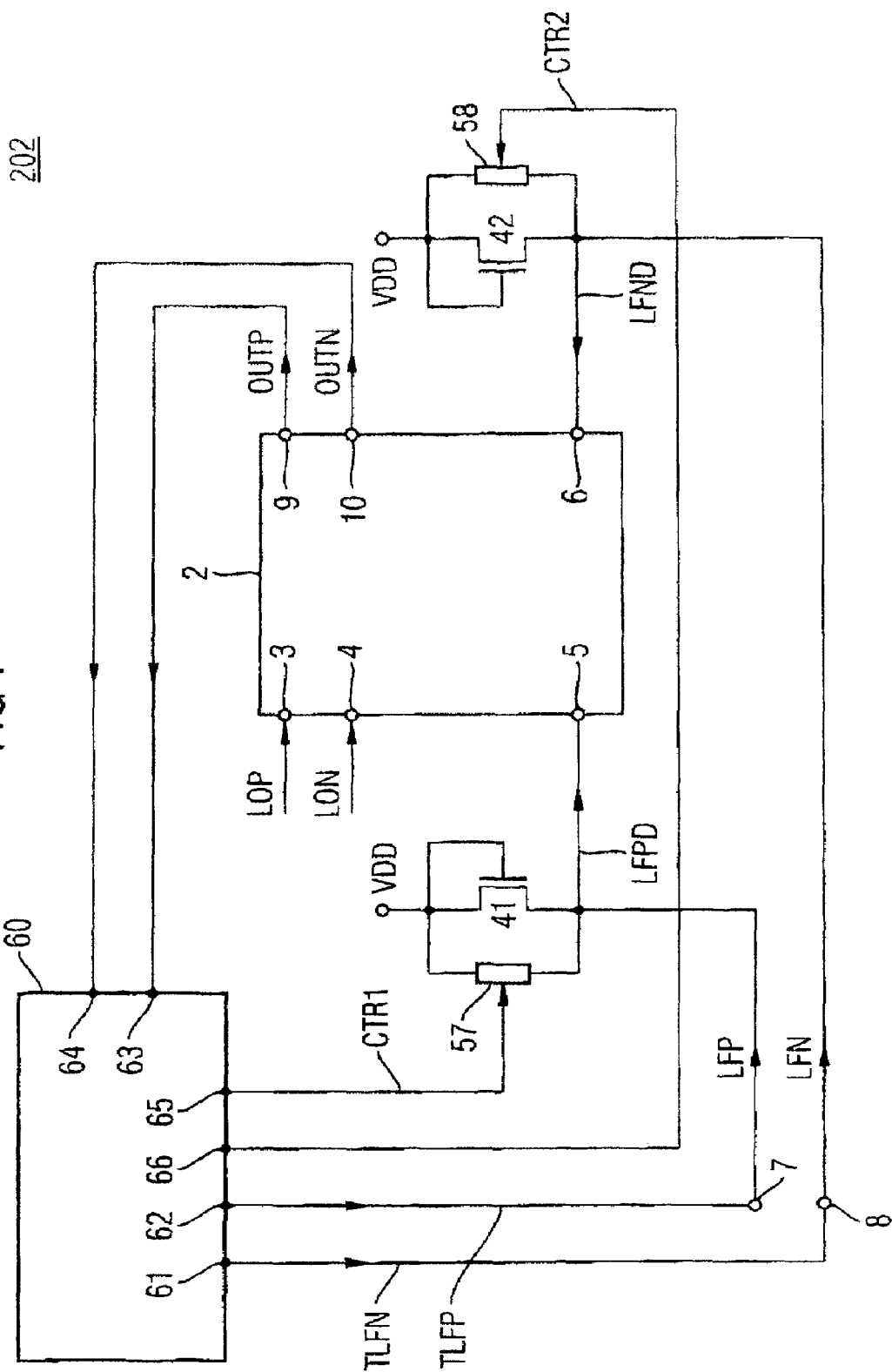
FIG. 7 shows a preferred development of the circuit arrangement according to the invention.

FIG. 7 shows a preferred development of the mixer 202 according to the invention.

A multiplicative mixing stage 2 is again provided, having carrier signal terminals 3, 9, mixing stage input terminals 5, 6 and output terminals 9, 10. To provide quadratic predistortion, two diode-connected transistors 41, 42 are provided between the mixing stage input terminals 5, 6 and the first supply voltage potential VDD as in FIG. 6.

The controlled path of the first transistor 41 is connected in parallel with an adjustable or programmable resistor 57. The controlled path of the second transistor 42 is connected in parallel with a second adjustable or programmable resistor 58.

Furthermore, a predistortion control 60 is provided which exhibits a test signal output 61, 62 for outputting a differential test signal TLFP, TLFN to the input terminals 7, 8. The predistortion control 60 has a test signal input 63, 64 to which the differential output signal OUTP, OUTN of the mixing stage 2 is coupled. The predistortion control 60 also has at least 2 control outputs 65, 66 for outputting the adjustment signals CTR1, CTR2 for adjusting the first and second resistor 57, 58.

The predistortion control 60 provides, for example, a differential test signal TLFP, TLFN with constant frequency which is coupled to the terminals 7, 8.

At the same time, the predistortion control 60 receives the resultant output signal OUTP, OUTN of the multiplicative mixing stage 2.

The predistortion control 60 controls the resistance values of the first and second resistor 57, 58 via the adjustment signals CTR1, CTR2, in such a manner that the spurious-interference-free dynamic range becomes maximum. This can be done, for example, as explained in FIG. 4 by means of the spectral data representation. The predistortion control 60 can both be integrated in the mixer 202 according to the invention or act as an external device. In this case, the programmable resistors 57, 58 can be programmed accordingly, for example during production.

The present circuit arrangement for a wideband mixer, therefore, provides excellent linearity over a wide frequency range, is preferably constructed in CMOS technology as a result of which the current consumption is low, supplies an improved spurious-interference-free dynamic range compared with the prior art and can thus be used in future ultra wideband applications.

The invention claimed is:

1. A circuit arrangement for a wideband mixer, comprising:
   a multiplicative mixing stage having a carrier frequency input, a differential signal input, and a differential mixing state output;
   a predistortion circuit coupled to the differential signal input, and further configured to receive at least a part of a differential input signal, the predistortion circuit configured to generate a differential output signal using quadratic predistortion and linear predistortion, the predistortion circuit operable to provide the differential output signal to the differential signal input of the multiplicative mixing stage.

2. The circuit arrangement as claimed in claim 1, wherein the predistortion circuit further includes a first predistortion section having a first input terminal configured to receive a first component of the differential input signal and a second predistortion section having a second input terminal configured to receive a second component of the differential signal.

3. The circuit arrangement as claimed in claim 2, wherein the first predistortion section includes a first resistor coupled between a first supply voltage potential and the first input terminal, and the second predistortion section includes a second resistor coupled between the second input terminal and the first supply voltage potential.

4. The circuit arrangement as claimed in claim 3, wherein at least the first resistor comprises an adjustable resistor.

5. The circuit arrangement as claimed in claim 3, wherein the first predistortion section further comprises a plurality of resistors including the first resistor, each of the plurality of resistors being switchably connected in parallel between the first supply voltage terminal and the first input terminal.

6. The circuit arrangement as claimed in claim 2, wherein the predistortion circuit includes a first transistor having a controlled path connected between the first input terminal and a first supply voltage potential, and a second transistor having a controlled path connected between the second input terminal and the first supply voltage potential, and the first and second transistors having gate terminals connected to one another and connected to a distortion potential.

7. The circuit arrangement as claimed in claim 6, wherein the distortion potential is the first supply voltage potential.

8. The circuit arrangement as claimed in claim 1, wherein the predistortion circuit further includes at least one diode configured to generate the quadratic predistortion.

9. The circuit arrangement as claimed in claim 1, wherein the wherein the multiplicative mixing stage comprises a Gilbert cell.

10. The circuit arrangement as claimed in claim 4, further comprising a predistortion control circuit, the predistortion control circuit including:
    a test signal output configured to provide a test signal to the first input terminal and the second input terminal;
    a test signal input coupled to the differential mixing state output; and
    at least one control output configured to provide adjustment control signals to the adjustable first resistor.

11. The circuit arrangement as claimed in claim 1, wherein the circuit arrangement is constructed in MOS technology.

12. The circuit arrangement as claimed in claim 1, wherein the linear predistortion is selected in such a manner that the spurious-interference-free dynamic range of an output signal of the multiplicative mixing stage is maximum for a differential input signal having a predetermined frequency.

13. The circuit arrangement as claimed in claim 1, wherein the multiplicative mixing stage comprises a single-sideband mixing stage.

14. The circuit arrangement as claimed in claim 1, wherein the linear predistortion is selected such that, over a predetermined range of carrier frequencies, the signal energy of an output signal is equal to the signal energy of a third harmonic of the differential input signal within the output signal at the frequency of the carrier frequency signal.

15. A method for mixing a carrier frequency signal and an input signal, comprising:
    (a) effecting linear predistortion and quadratic predistortion of the input signal in order to generate a predistorted input signal; and
    (b) mixing the predistorted input signal with the carrier frequency signal to form an output signal.

16. The method as claimed in claim 15, wherein the linear component of the predistortion is selected in such a manner that the spurious-interference-free dynamic range of the output signal is maximum with an input signal which exhibits a predetermined frequency.

17. The method as claimed in claim 15, wherein step a) further comprises effecting linear distortion at least in part using a resistive circuit having at least one resistor and a circuit resistance.

18. The method as claimed in claim 17, wherein step a) further comprises effecting linear distortion using a resistive circuit having an adjustable circuit resistance.

19. A circuit arrangement for a wideband mixer, comprising:
    a mixing stage having a carrier frequency input, a differential signal input, and a differential mixing state output;
    a predistortion circuit coupled to the differential signal input, and further configured to receive at least a part of a differential input signal, the predistortion circuit configured to generate a differential output signal using quadratic predistortion and linear predistortion, the predistortion circuit including a resistive circuit having a resistance value to generate the linear predistortion, the predistortion circuit operable to provide the differential output signal to the differential signal input of the mixing stage.

20. The circuit arrangement according to claim 19, wherein the predistortion circuit further comprises a nonlinear circuit configured to generate the quadratic predistortion, the nonlinear circuit comprising at least one of the group consisting of a transistor and a diode.

* * * * *